United States Patent [19]
Roth

[11] Patent Number: 5,148,354
[45] Date of Patent: Sep. 15, 1992

[54] CONNECTOR FOR USE WITH A PRINTED CIRCUIT BOARD

[75] Inventor: Gregory A. Roth, Dearborn, Mich.

[73] Assignee: Ford Motor Company, Dearborn, Mich.

[21] Appl. No.: 530,045

[22] Filed: May 29, 1990

[51] Int. Cl.$^5$ ............................................. H05K 7/02
[52] U.S. Cl. .................................. 361/400; 361/413; 439/485
[58] Field of Search ............... 361/389, 400, 404, 405, 361/417, 419, 420, 396, 393, 386, 387, 388, 413; 439/78, 79, 438, 439, 455, 620, 485

[56] References Cited

U.S. PATENT DOCUMENTS

| | | | |
|---|---|---|---|
| 3,518,493 | 6/1970 | Bathrick, Jr. et al. | 439/485 X |
| 3,631,380 | 12/1971 | Bohn | 439/638 |
| 3,963,300 | 6/1976 | Patton et al. | 439/638 |
| 4,188,653 | 2/1980 | Goepel | 361/405 |
| 4,502,101 | 2/1985 | Jodoin | 361/386 |
| 4,519,658 | 5/1985 | Biswas | 361/393 |
| 4,631,639 | 12/1986 | Biraud | 361/417 |

Primary Examiner—Leo P. Picard
Assistant Examiner—D. Sparks
Attorney, Agent, or Firm—Roger L. May; Mark L. Mollon

[57] ABSTRACT

A connector is provided for being connected to a printed circuit board and mounting thereto a high current device, such as a MOSFET, so that high current conducted through the device does not pass through circuit paths on the circuit board. The connector includes a housing having first and second ports formed therein. A plurality of first electrical conductors are mounted in the housing. Each of the first conductors has a first end extending into one of the first and second ports and a second end extending out from the housing to the printed circuit board for being connected to a circuit path on the board. A plurality of second electrical conductors are also mounted in the housing. Each of the second conductors has a first end extending into the first port and a second end extending into the second port. The connector further includes a plurality of device conductors which are mounted in the housing. Each of the device conductors has a first end extending into one of the first and second ports and a second end extending from the housing. The second end of each of the device conductors is connected to a respective lead pin of the high current device so that high current conducted through the current device does not pass through circuit paths on the board.

29 Claims, 3 Drawing Sheets

FIG-6
CONNECTOR FOR USE WITH A PRINTED CIRCUIT BOARD

BACKGROUND OF THE INVENTION

The present invention relates generally to a connector for providing electrical connections to a printed circuit board and, more particularly, to such a connector which further provides for mounting a high current device so that high current conducted through the device does not pass through circuit paths on the printed circuit board.

Connectors having one or more ports for receiving an intermating connector in each port have been connected to printed circuit boards in the prior art. One known connector has two ports positioned end-to-end relative to one another. It is also known in the prior art to employ high current devices, such as relays, solenoids, power transistors, for example, metal-oxide-semiconductor field-effect transistors (MOSFETs), and the like on printed circuit boards. The present invention is particularly applicable to power transistors and will be described relative to mounting MOSFETs.

One or more MOSFETs can be mounted to a first side of a printed circuit board and a connector can be mounted onto or supported adjacent the same side of the board. Lead pins from the MOSFET(s) and electrical conductors from the connector fit into openings in the circuit board and extend therethrough to a second side of the board. The lead pins and electrical conductors are then connected to circuit paths located on the second side of the board by dip or wave-soldering, thereby permitting the MOSFET(s) to be interconnected with the connector.

U.S. Pat. No. 4,803,590 further teaches mounting semiconductor power components directly onto an electrical connector which is in turn connected to a printed circuit board. However, high current leads of the power components are interconnected to electrical conductors of the connector via circuit paths on the board.

Unfortunately, interconnecting power components, such as MOSFETs, with a connector by employing circuit paths running along the circuit board results in high current passing through the MOSFET(s) being supported upon the printed circuit board. Such arrangements have been found to be undesirable because: 1) high current on printed circuit paths create noise and interfere with signals on other paths on the board; 2) locating MOSFET(s) on the board uses valuable board space; 3) MOSFET(s) generate a substantial amount of heat which is difficult to dissipate if the MOSFET(s) are mounted on the board; 4) circuit paths on the board are susceptible to damage from high currents which are within the current specifications of the MOSFET(s); and, 5) circuit paths on the board connected with the MOSFET(s) are large and thus also use valuable board space.

Accordingly, a need exists for an improved arrangement for interconnecting high current devices, such as MOSFETs, with a connector associated with a circuit board so that high currents conducted through the devices do not pass through circuit paths on the board.

SUMMARY OF THE INVENTION

This need is met by the connector of the present invention which permits one or more high current devices to be connected directly to the connector and electrically connected with circuit elements on the board yet prevent the high current passing through each device from passing through circuit paths on the board.

In the present invention, one or more high current devices, such as MOSFETs, are mounted directly onto a connector which is connected to a first side of a circuit board. Each MOSFET includes lead pins which extend therefrom toward the circuit board. The connector includes a plurality of device conductors which extend out from the connector toward the circuit board. The lead pins and device conductors are placed into common openings in the board which are not associated with any of the circuit paths on the board and extend therethrough to a second side of the board. The device conductors are connected directly to the lead pins on the second side of the board as the remaining circuits and conductor leads are connected by dip or wave-soldering. As a result, in one soldering operation, circuit board connections and connections of the MOSFETs directly through the connector are made yet high currents conducted through the MOSFETs do not pass through circuit paths on the board.

In accordance with a first aspect of the present invention, a connector/high current device assembly capable of being connected to a printed circuit board is provided and includes: at least one high current device having a plurality of lead pins extending therefrom, and a connector capable of being connected to the printed circuit board and mounting the high current device thereto without high current conducted through the device passing through circuit paths on the printed circuit board. The connector includes a housing, port means located in the housing for receiving at least one connecting device, and a plurality of device conductors mounted in the housing. Each device conductor has a first end extending into the port means and a second end extending from the housing. The second end of each of the device conductors is connected to one of the lead pins to connect the current device directly through the connector so that high current conducted through the current device does not pass through the circuit paths on the printed circuit board.

The connector further comprises a plurality of first electrical conductors mounted in the housing. Each of the first conductors has a first end extending into the port means and a second end extending from the housing to the printed circuit board for being connected to a circuit path on the printed circuit board.

The second end of each of the device conductors preferably comprises an eyelet. The eyelets mounted in respective openings in the printed circuit board which are not associated with any circuit paths on the board and extend through the openings to an underside of the board. Each of the eyelets includes an opening for receiving its respective lead pin therein. The lead pins extend through the eyelets to the underside of the board so that each of the eyelets may be soldered to its respective lead pin on the underside of the printed circuit board in a single wave soldering operation.

The housing preferably includes a heat sink means for supporting the at least one high current device and conducting heat therefrom. The high current device may comprise a transistor, such as a MOSFET. The assembly may further comprise one or more additional high current devices located on the housing.

The port means comprises first and second ports which are preferably located at substantially 90 degrees to one another. The connector preferably includes a plurality of second electrical conductors mounted in the housing. Each of the second conductors has a first end extending into the first port and a second end extending into the second port so that electrical signals and/or high current from a first connecting device may pass directly through the connector to a second connecting device without passing through circuit paths on the board.

Preferably, each of a first portion of the device conductors has its first end extending into the first port and each of a second portion of the device conductors has its first end extending into the second port. It is further preferred that each of a first portion of the first conductors has its first end extending into the first port and each of a second portion of the first conductors has its first end extending into the second port.

In accordance with another aspect of the present invention a connector/circuit device assembly capable of being connected to a printed circuit board is provided and comprises: at least one circuit device having a plurality of lead pins extending therefrom, and a connector capable of being connected to the printed circuit board and mounting the circuit device thereto. The connector includes a housing, port means located in the housing for receiving at least one connecting device, and a plurality of device conductors mounted in the housing. Each conductor has a first end extending into the port means and a second end extending from the housing. The second end of each of the conductors is connected to one of the lead pins to connect the circuit device through the connector so that current conducted through the lead pins connected to the device conductors does not pass through circuit paths on the printed circuit board.

In accordance with a further aspect of the present invention, a connector capable of being connected to a printed circuit board is provided and comprises: a housing associated with the printed circuit board; first port means located in the housing for receiving a first connecting device; second port means located in the housing for receiving a second connecting device; a plurality of first electrical conductors mounted in the housing; and, a plurality of second electrical conductors mounted in the housing. Each of the first conductors has a first end extending into one of the first and second port means and a second end extending from the housing to the printed circuit board for being connected to a circuit path on the board. Each of the second conductors has a first end extending into the first port means and a second end extending into the second port means.

Preferably, each of a first portion of the first conductors has its first end extending into the first port means and each of a second portion of the first conductors has its first end extending into the second port means. It is further preferred that the first and second port means be located at substantially 90 degrees to one another.

The housing is capable of supporting at least one high current device having a plurality of lead pins extending therefrom. The connector further comprises a plurality of device conductors mounted in the housing. Each of the device conductors has a first end extending into one of the first and second port means and a second end extending from the housing. The second end of each of the device conductors is connected to one of the lead pins of the high current device so that high current conducted through the current device does not pass through circuit paths on the printed circuit board.

The second end of each of the device conductors preferably comprises an eyelet. The eyelets are mounted in respective openings in the printed circuit board which are not associated with any circuit paths on the board and extend through the openings to an underside of the board so that each eyelet may be soldered to its respective lead pin on the underside of the board.

In accordance with still another aspect of the present invention, a connector capable of being connected to a printed circuit board is provided and comprises: a housing associated with the printed circuit board; first port means located in the housing for receiving a first connecting device; second port means located in the housing for receiving a second connecting device; and, a plurality of electrical conductors mounted in the housing. The first and second port means are preferably positioned longitudinally side-by-side to one another in the housing. Each of a first portion of the conductors has a first end extending into the first port means and a second end extending out from the housing to the printed circuit board for being connected to a circuit path on the board. Each of a second portion of the conductors has a first end extending into the second port means and a second end extending out from the housing to the printed circuit board for being connected to a circuit path on the board.

In accordance with still a further aspect of the present invention, a method for interconnecting a connector unit associated with a printed circuit board and a high current device using a single soldering operation is provided and comprises the steps of: providing a plurality of conductors extending from said connector unit in a direction for passing through said printed circuit board; securing said high current device to said connector unit so that at least one lead of said high current device is placed in proximity to a respective one of said conductors; inserting said lead and said respective conductor into a common opening in said printed circuit board, said common opening not being associated with any circuit path on said printed circuit board; and applying solder to said printed circuit board, thereby connecting said lead with said respective conductor.

Accordingly, it is an object of the present invention to provide a connector for a printed circuit board which permits one or more high current devices to be connected directly to the connector so that high current conducted through each device does not pass through circuit paths on the board. This and other objects and advantages of the invention will be apparent from the following description, the accompanying drawings and the appended claims.

DETAILED DESCRIPTION OF THE INVENTION

Figure 1:
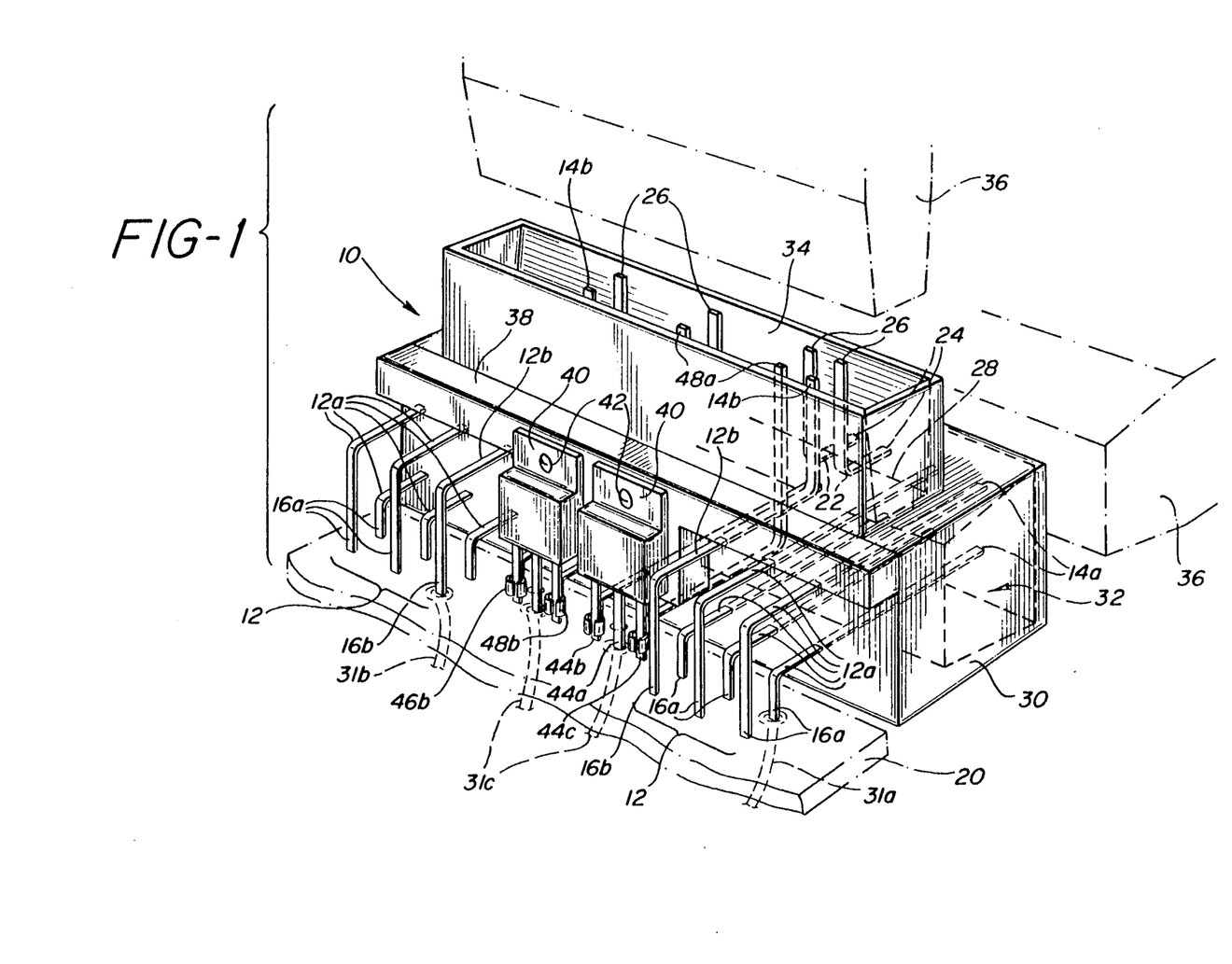
FIG. 1 is a perspective view of the connector of the present invention having two high current devices mounted thereon.
Figure 4:
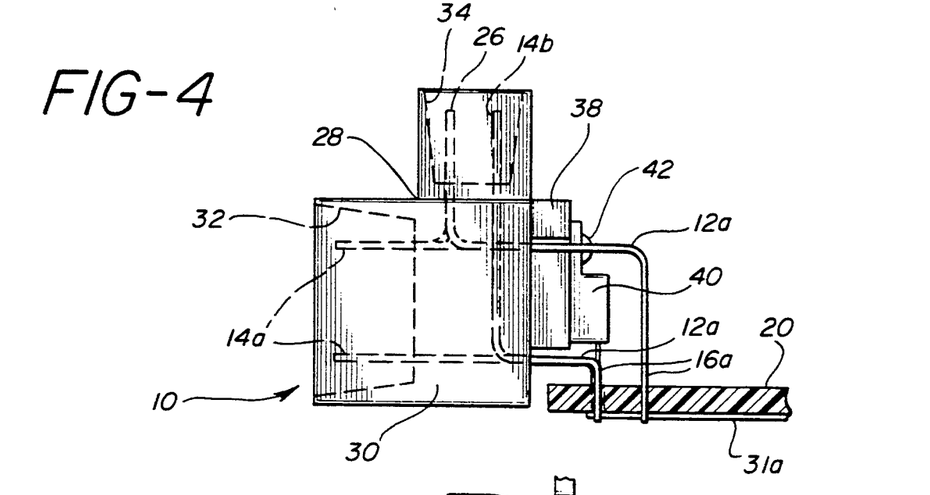
FIG. 4 is a side elevational view of the connector of FIG. 1 connected to a circuit board which is shown in section.

The connector of the present invention, generally designated by the reference numeral 10, is connected to a circuit board, shown in broken line at 20 in FIG. 1. The connector 10 and the circuit board 20 may be mounted within a containing unit (not shown) so that the connector 10 may be positioned adjacent to the circuit board 20, as shown in FIGS. 1 and 4. The connector 10 comprises a polymeric housing 30 having first and second ports 32 and 34, respectively, formed therein. The first and second ports 32 and 34 are each capable of receiving and connecting with further connecting devices, shown in broken line at 36 in FIG. 1. Each connecting device 36 may comprise an input or output module, a wiring harness and the like.

Figure 3:
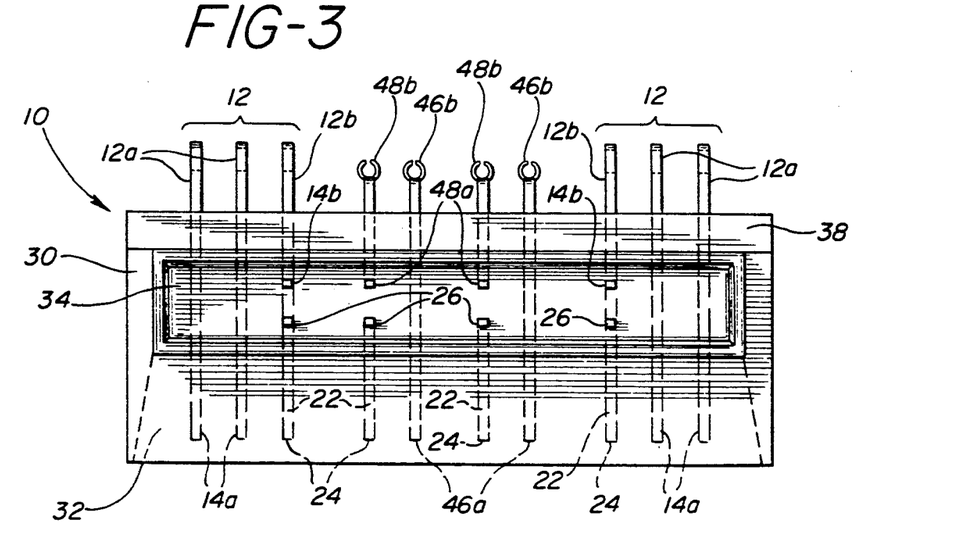
FIG. 3 is a top plan view of the connector of FIG. 1 with the high current devices removed from the connector.

A plurality of first electrical conductors 12 are mounted in the housing 30. As best shown in FIGS. 1 and 3, each of a first portion 12a of the first conductors 12 has a first end 14a extending into the first port 32 and a second end 16a extending out from the housing 30 toward the circuit board 20. The second ends 16a extend through respective openings in the circuit board 20, and are dip or wave-soldered to circuit paths 31a on the underside of the board 20 in a known manner, see FIGS. 1 and 4.

Each of a second portion 12b of the first conductors 12 has a first end 14b extending into the second port 34 and a second end 16b extending out from the housing 30 toward the printed circuit board 20. The second ends 16b also extend through respective openings in the circuit board 20, and are dip or wave-soldered to circuit paths 31b on the underside of the board 20.

The first and second ports 32 and 34 are preferably located at substantially 90 degrees to one another and joined along a common longitudinal edge 28, as shown in FIGS. 1 and 4, so that the ports 32 and 34 are positioned longitudinally side-by-side in the housing 30. As a result, port 32 is permitted to connect, by way of the conductors 12a, with the first circuit paths 31a on the board which may be located adjacent to and interspersed with the second circuit paths 31b on the board connected to port 34 by way of conductors 12b.

A plurality of second electrical conductors 22 are also mounted in the housing 30. As best shown in FIGS. 1 and 3, each of the second conductors 22 has a first end 24 extending into the first port 32 and a second end 26 extending into the second port 34. By extending the first and second ends 24 and 26 into the first and second ports 32 and 34 electrical signals and/or high currents from a first connecting device 36 are permitted to pass directly through the connector 10 to a second connecting device 36 without being conducted through circuit paths 31 on the board 20.

One or more high current devices 40, such as metal-oxide-semiconductor field-effect transistors (MOSFETs), may be mounted directly to the housing 30. Preferably, the housing 30 includes a heat sink 38 upon which the high current devices 40 are mounted so that heat generated by the devices 40 may be conducted away therefrom by the heat sink 38. Known attachment means, such as screws 42, may be employed to mount the devices 40 onto the heat sink 38 in order to insure proper thermal contact between the high current devices 40 and the heat sink 38. The heat sink 38 is preferably made from aluminum and is mounted to the housing in a known manner, such as by adhesive, screws and the like.

Figure 2:
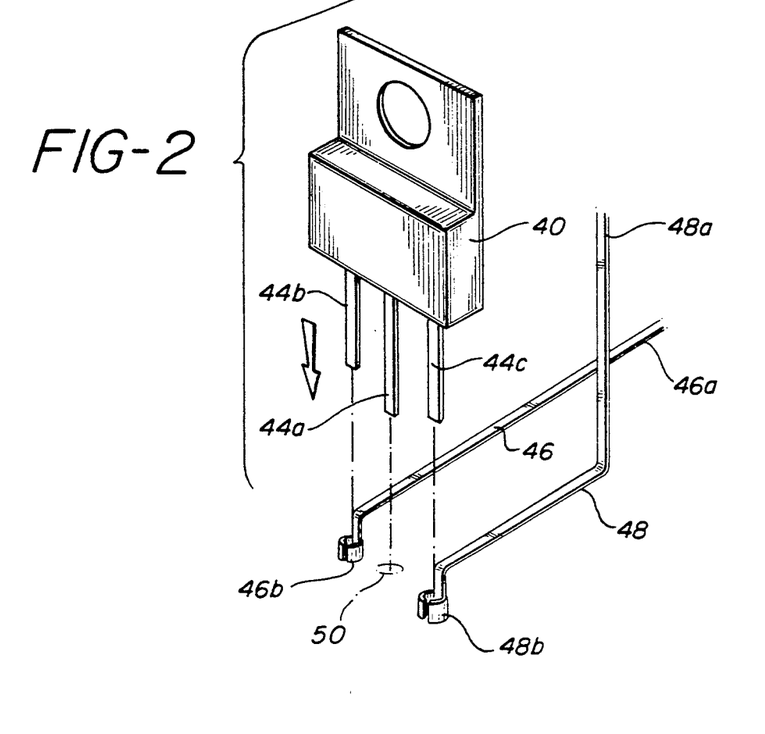
FIG. 2 is a perspective view on an enlarged scale showing lead pins on a high current device passing into device conductors of the connector of FIG. 1.

Each high current device 40, as best shown in FIGS. 1 and 2, comprises three lead pins 44a-c which extend down toward the printed circuit board 20. A gate or base lead pin 44a extends through an opening in the circuit board 20 and is dip or wave-soldered to a corresponding circuit path 31c on the underside of the board 20 which controls the operation of the device 40. First and second high current lead pins 44b and 44c are connected to corresponding first and second device conductors 46 and 48 mounted in the housing 30. The lead pins 44b and 44c are connected directly to the device conductors 46 and 48 so that high current passing through the pins 44b and 44c does not pass through circuit paths on the circuit board 20.

Figures 5, 6:
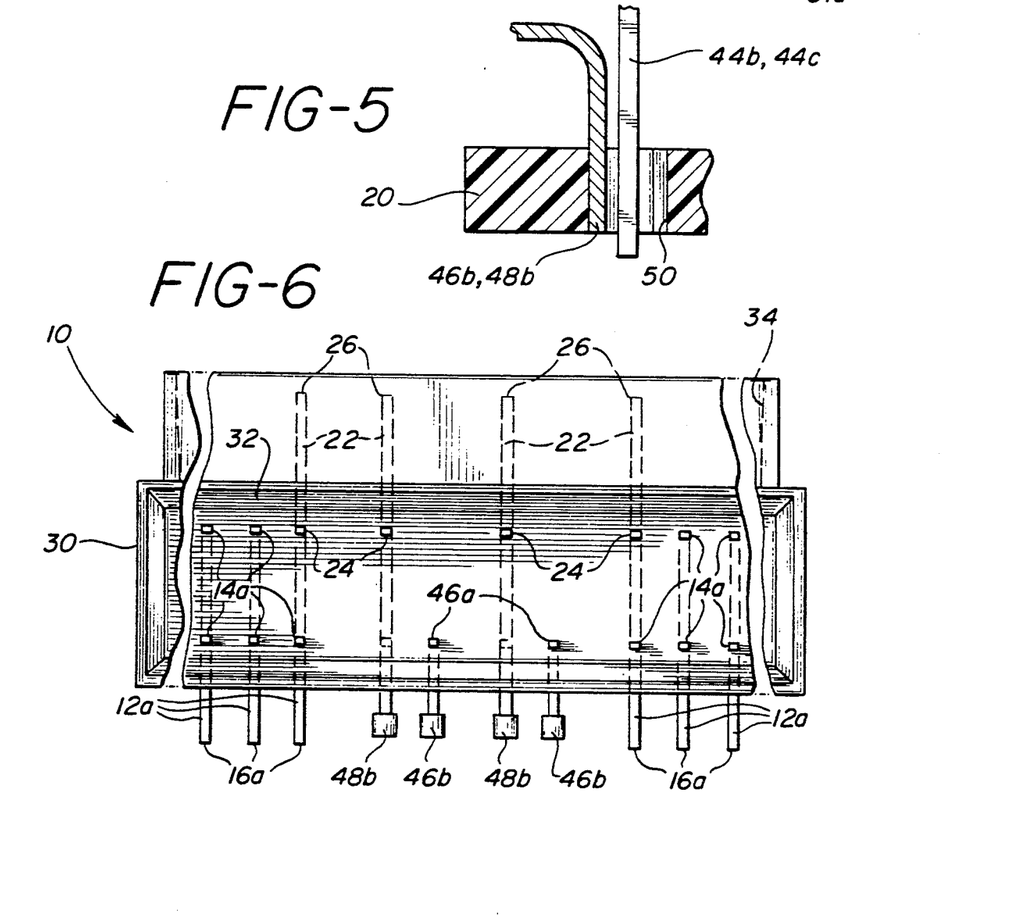
FIG. 5 is a sectional view on an enlarged scale of a device conductor mounted in a printed circuit board and having a lead pin located therein.
FIG. 6 is a rear elevational view of the connector of FIG. 1 with the high current devices removed from the connector.

Referring to FIG. 3, the first end 46a of each of the first device conductors 46 extends into the first port 32. The first end 48a of each of the second device conductors 48 extends into the second port 34. The second ends of the first and second device conductors 46 and 48 are preferably formed as eyelets 46b and 48b, respectively. The eyelets 46b and 48b are mounted within respective openings 50 in the board 20 which are not associated with any of the circuit paths on the board 20 and extend to an underside of the board 20, as best shown in FIG. 5. Each of the eyelets 46b and 48b preferably has a split cylindrical shape for receiving its respective lead pin 44b or 44c therein. The lead pins 44b and 44c extend through the eyelets 46b and 48b to the underside of the board and are directly connected to the eyelets 46b and 48b during dip or wave-soldering of the under side of the board 20. It is further preferable that the eyelets 46b and 48b have a cylindrical shape because the solder is more likely to join with the eyelets 46b and 48b and the lead pins 44b and 44c during the soldering step if the eyelets have a cylindrical shape. Since the eyelets 46b and 48b are connected with the lead pins 44b and 44c during dip or wave-soldering of the underside of the board 20, a separate step for connecting the lead pins 44b and 44c to the device connectors 46 and 48 is eliminated.

The shape of the eyelets 46b and 48b is preferably cylindrical, as set forth above, but could be square, rectangular, octagonal, or the like. Further, the second end of each of the device conductors 46 and 48 may be shaped as a pin rather than as an eyelet. Additionally, the second end of each of the device conductors 46 and 48 may be connected to its respective lead pin 44b or 44c without the conductor or the lead pin extending into or through an opening in the board.

By the present invention a high current device, such as a MOSFET may be mounted directly onto a connector so that high current conducted through the device does not pass through circuit paths on the board. The connector of the present invention includes two ports which are positioned longitudinally side-by-side in the housing. Since the ports are positioned side-by-side, the first port is permitted to connect, by way of a first portion of first conductors, with first circuit paths on a circuit board which may be located adjacent to and interspersed with second circuit paths connected to the second port by way of a second portion of the first conductors. The connector further includes second electrical conductors which have first and second ends extending into the first and second ports, thereby permitting electrical signals and/or high currents to pass from a first connecting device to a second connecting device without passing through circuit paths on the board.

Having described the invention in detail and by reference to preferred embodiments thereof, it will be apparent that modifications and variations are possible without departing from the scope of the invention defined in the appended claims. For example, it is contemplated that any device, including devices which are not high current devices, may be connected directly to the connector in accordance with the mounting arrangement of the present invention.

What is claimed is:

1. A connector/high current device assembly capable of being connected to a printed circuit board having circuit paths thereon comprising:
    at least one high current device having a plurality of lead pins extending therefrom; and
    a connector capable of being connected to said printed circuit board and mounting said at least one high current device thereto without high current conducted through said device passing through said circuit paths on said printed circuit board, said connector including a housing, port means located in said housing for removably receiving at least one connecting device, and a plurality of device conductors mounted in said housing, each of said device conductors having a first end extending into said port means and connecting with said at least one connecting device with said at least one connecting device received within said port means and a second end extending from said housing, said second end of each of said device conductors being connected directly to one of said lead pins to connected said at least one high current device directly through said connector so that high current conducted through said at least one high current device does not pass through said circuit paths on said printed circuit board.

2. A connector/high current device assembly as claimed in claim 1 further comprising a printed circuit board and wherein said connector further comprises a plurality of first electrical conductors mounted in said housing, each of said first conductors having a first end extending into said port means and a second end extending from said housing to said printed circuit board and connected to a circuit path on said printed circuit board.

3. A connector/high current device assembly as claimed in claim 1 further comprising a printed circuit board and wherein said second end of each of said device conductors comprises an eyelet, said eyelets being mounted in respective openings in said printed circuit board which are not associated with any circuit paths on said printed circuit board and extending through the openings to an underside of said printed circuit board.

4. A connector/high current device assembly as claimed in claim 3, wherein each of said eyelets includes an opening for receiving its respective lead pin therein, said lead pins extending through said eyelets to the underside of said printed circuit board, whereby each of said eyelets may be soldered to its respective lead pin on the underside of said printed circuit board in a single soldering operation.

5. A connector/high current device assembly as claimed in claim 1, wherein said housing includes a heat sink means for supporting said at least one high current device and conducting heat therefrom.

6. A connector/high current device assembly as claimed in claim 1, further comprising one or more additional high current devices located on said housing.

7. A connector/high current device assembly as claimed in claim 1, wherein said high current device comprises a transistor.

8. A connector/high current device assembly as claimed in claim 1, wherein said high current device comprises a MOSFET.

9. A connector/high current device assembly as claimed in claim 1, wherein said port means comprises first and second ports.

10. A connector/high current device assembly as claimed in claim 9, further comprising a printed circuit board and wherein said connector further comprises a plurality of first electrical conductors mounted in said housing, each of said first conductors having a first end extending into one of said first and second ports and a second end extending from said housing to said printed circuit board for being connected to a circuit path on said board.

11. A connector/high current device assembly as claimed in claim 9, wherein said connector further comprises a plurality of second electrical conductors mounted in said housing, each of said second conductors having a first end extending into said first port and a second end extending into said second port.

12. A connector/high current device assembly as claimed in claim 9, wherein each of a first portion of said device conductors has its first end extending into said first port and each of a second portion of said device conductors has its first end extending into said second port.

13. A connector/high current device assembly as claimed in claim 10, wherein each of a first portion of said first conductors has its first end extending into said first port and each of a second portion of said first conductors has its first end extending into said second port.

14. A connector/high current device assembly as claimed in claim 9, wherein said first and second ports are located at substantially 90 degrees to one another.

15. A connector/circuit device assembly capable of being connected to a printed circuit board having circuit paths thereon comprising:
    at least one circuit device having a plurality of lead pins extending therefrom; and
    a connector capable of being connected to said printed circuit board and mounting said circuit device thereto, said connector including a housing, port means located in said housing for removably receiving at least one connecting device, and a plurality of device conductors mounted in said housing, each of said device conductors having a first end extending into said port means and connecting with said at least one connecting device with said at least one connecting device received within said port means and a second end extending from said housing, said second end of each of said device conductors being directly connected directly to one of said lead pins to connect said circuit device through said connector so that current conducted through said lead pins connected to said device conductors does not pass through said circuit paths on said printed circuit board.

16. A connector capable of being connected to a printed circuit board having circuit paths thereon comprising:
   a housing associated with said printed circuit board;
   first port means located in said housing for removably receiving a first connecting device therein;
   second port means located in said housing for removably receiving a second connecting device therein;
   a plurality of first electrical conductors mounted in said housing, each of said first conductors having a first end extending into one of said first and second port means and a second end extending from said housing to said printed circuit board for being connected to a circuit path on said board; and
   a plurality of second electrical conductors mounted in said housing, each of said second conductors having a first end extending into said first port means and a second end extending into said second port means.

17. A connector as claimed in claim 16, wherein each of a first portion of said first conductors has its first end extending into said first port means and each of a second portion of said first conductors has its first end extending into said second port means.

18. A connector as claimed in claim 16, wherein said housing includes means for supporting at least one high current device having a plurality of lead pins extending therefrom.

19. A connector as claimed in claim 18 further comprising a plurality of device conductors mounted in said housing, each of said device conductors having a first end extending into one of said first and second port means and a second end extending from said housing, said second end of each of said device conductors being adapted to be connected to one of the lead pins of at least one high current device supported by said housing so that high current conducted through at least one high current device does not pass through said circuit paths on said printed circuit board.

20. A connector as claimed in claim 19, wherein said second end of each of said device conductors comprises an eyelet, each of said eyelets being adapted to receive one of said lead pins.

21. A connector as claimed in claim 16, wherein said first and second port means are located at substantially 90 degrees to one another.

22. A connector capable of being connected to a printed circuit board having circuit paths thereon comprising:
   a housing associated with said printed circuit board;
   a first port means located in said housing for receiving a first connecting device;
   a second port means located in said housing for receiving a second connecting device, said first and second ports being positioned longitudinally side-by-side with one another in said housing; and
   a plurality of electrical conductors mounted in said housing, each of a first portion of said electrical conductors having a first end extending into said first port and a second end extending from said housing to said printed circuit board for being connected to a circuit path on said board, and each of a second portion of said conductors having a first end extending into said second port and a second end extending out from said housing to said printed circuit board for being connected to a circuit path on said board.

23. A method for interconnecting a connector unit associated with a printed circuit board and a high current device using a single soldering operation comprising the steps of:
   providing a plurality of conductors extending from said connector unit in a direction for passing through said printed circuit board;
   securing said high current device to said connector unit so that at least one lead of said high current device is placed in proximity to a respective one of said conductors;
   inserting said lead and said respective conductor into a common opening in said printed circuit board, said common opening not being associated with any circuit path on said printed circuit board; and
   applying solder to said printed circuit board, thereby connecting said lead with said respective conductor.

24. A connector/high current device assembly capable of being connected to a printed circuit board having circuit paths thereon comprising:
   at least one circuit device having a plurality of lead pins extending therefrom; and
   a connector capable of being connected to said printed circuit board and mounting said circuit device thereto without high current conducted through said device passing through said circuit paths on said printed circuit board, said connector including a housing, port means located in said housing for receiving at least one connecting device, a plurality of device conductors mounted in said housing, each device conductor having a first end extending into said port means and a second end extending from said housing, said second end of each of said device conductors being connected to one of said lead pins to connect said at least one high current device directly through said connector so that high current conducted through said at least one high current device does not pass through said circuit paths on said printed circuit board, and a plurality of first electrical conductors mounted in said housing, each of said first conductors having a first end extending into said port means and a second end extending from said housing to said printed circuit board for being connected to a circuit path on said printed circuit board.

25. A connector/high current device assembly capable of being connected to a printed circuit board comprising:
   at least one high current device having a plurality of lead pins extending therefrom; and
   a connector capable of being connected to said printed circuit board and mounting said at least one high current device thereto without high current conducted through said device passing through said circuit paths on said printed circuit board, said connector including a housing, port means located in said housing for receiving at least one connecting device, and a plurality of device conductors mounted in said housing, each of said device conductors having a first end extending into said port means and a second end extending from said housing, said second end of each of said device conductors comprising an eyelet connected directly to one of said lead pins to connected said at least one high current device directly through said connector so that high current conducted through said at least one high current device does not pass through said circuit paths on said printed circuit board, said eyelets being mounted in respective openings in said printed circuit board which are not associated with any circuit paths on said board and extending through the openings to an underside of said board.

26. A connector/high current device assembly capable of being connected to a printed circuit board having circuit paths thereon comprising:
   at least one high current device having a plurality of lead pins extending therefrom; and
   a connector capable of being connected to said printed circuit board and mounting said at least one high current device thereto without high current conducted through said device passing through said circuit paths on said printed circuit board, said connector including a housing having heat sink means for supporting said at least one high current device and conducting heat therefrom, port means located in said housing for receiving at least one connecting device, and a plurality of device conductors mounted in said housing, each of said device conductors having a first end extending into said port means and a second end extending from said housing, said second end of each of said device conductors being connected to one of said lead pins to connect said at least one high current device directly through said connector so that high current conducted through said at least one high current device does not pass through said circuit paths on said printed circuit board.

27. A connector/high current device assembly capable of being connected to a printed circuit board having circuit paths thereon comprising:
   at least one high current device having a plurality of lead pins extending therefrom; and
   a connector capable of being connected to said printed circuit board and mounting said at least one high current device thereto without high current conducted through said device passing through said circuit paths on said printed circuit board, said connector including a housing, port means located in said housing for receiving at least one connecting device, said port means comprising first and second ports, and a plurality of device conductors mounted in said housing, each device conductor having a first end extending into one of said first and second ports and a second end extending from said housing, said second end of each of said device conductors being connected to one of said lead pins to connect said at least one high current device directly through said connector so that high current conducted through said at least one high current device does not pass through said circuit paths on said printed circuit board.

28. A connector capable of being connected to a printed circuit board having circuit paths thereon comprising:
   a housing associated with said printed circuit board, said housing including means for supporting at least one high current device having a plurality of lead pins extending therefrom;
   a first port means located in said housing for receiving a first connecting device;
   a second port means located in said housing for receiving a second connecting device;
   a plurality of first electrical conductors mounted in said housing, each of said first conductors having a first end extending into one of said first and second port means and a second end extending from said housing to said printed circuit board for being connected to a circuit path on said board;
   a plurality of second electrical conductors mounted in said housing, each of said second conductors having a first end extending into said first port means and a second end extending into said second port means; and,
   a plurality of device conductors mounted in said housing, each of said device conductors having a first end extending into one of said first and second port means and a second end extending from said housing, said second end of each of said device conductors being connected to one of the lead pins of said at least one high current device so that high current conducted through said at least one high current device does not pass through said circuit paths on said printed circuit board.

29. A connector capable of being connected to a printed circuit board having circuit paths thereon comprising:
   a housing associated with said printed circuit board;
   first port means located in said housing for receiving a first connecting device;
   second port means located in said housing for receiving a second connecting device, said first and second port means being located at substantially 90 degrees relative to one another;
   a plurality of first electrical conductors mounted in said housing, each of said first electrical conductors having a first end extending into one of said first and second port means and a second end extending from said housing to said printed circuit board for being connected to a circuit path on said board; and
   a plurality of second electrical conductors mounted in said housing, each of said second electrical conductors having a first end extending into said first port means and a second end extending into said second port means.

* * * * *

UNITED STATES PATENT AND TRADEMARK OFFICE
CERTIFICATE OF CORRECTION

PATENT NO. : 5,148,354
DATED : September 15, 1992
INVENTOR(S) : Gregory A. Roth

It is certified that error appears in the above-identified patent and that said Letters Patent is hereby corrected as shown below:

Col. 7, line 38, "pins to connected" should be --pins to connect--.

Col. 9, line 52, "port means located" should be --port located--.

Col. 9, line 54, "port means located" should be --port located--.

Col. 9, line 61, "extending from" should be --extending out from--.

Col. 10, line 22, "one circuit device" should be --high current device--.

Col. 10, line 25, "said circuit device" should be --said high current device--.

Col. 10, line 50, please add "a printed circuit board having circuit paths thereon".

UNITED STATES PATENT AND TRADEMARK OFFICE
CERTIFICATE OF CORRECTION

PATENT NO. : 5,148,354

DATED : September 15, 1992

INVENTOR(S) : Gregory A. Roth

It is certified that error appears in the above-identified patent and that said Letters Patent is hereby corrected as shown below:

Col. 10, line 65, "to connected said" should be --to connect said--.

Signed and Sealed this

Ninth Day of November, 1993

Attest:

BRUCE LEHMAN

Attesting Officer

Commissioner of Patents and Trademarks